United States Patent
Manabe

(10) Patent No.: US 6,943,400 B2
(45) Date of Patent: Sep. 13, 2005

(54) SEMICONDUCTOR DEVICE AND ITS MANUFACTURING METHOD

(75) Inventor: Kazutaka Manabe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 82 days.

(21) Appl. No.: 10/618,508

(22) Filed: Jul. 11, 2003

(65) Prior Publication Data

US 2004/0014262 A1 Jan. 22, 2004

Related U.S. Application Data

(62) Division of application No. 10/106,642, filed on Mar. 26, 2002, now Pat. No. 6,638,801.

(30) Foreign Application Priority Data

Mar. 29, 2001  (JP) .......................................... 2001-096924

(51) Int. Cl.[7] ............................................... H01L 29/76
(52) U.S. Cl. ........................ 257/314; 257/315; 257/316; 257/317; 257/318; 257/319
(58) Field of Search ................................ 257/314, 315, 257/316, 317, 318, 319, 262

(56) References Cited

U.S. PATENT DOCUMENTS

| | | | |
|---|---|---|---|
| 5,047,816 A | * 9/1991 | Cuevas | 257/366 |
| 5,600,168 A | * 2/1997 | Lee | 257/336 |
| 5,821,581 A | * 10/1998 | Kaya et al. | 257/321 |
| 6,255,166 B1 | * 7/2001 | Ogura et al. | 438/257 |
| 6,420,233 B1 | * 7/2002 | Hsieh et al. | 438/257 |

* cited by examiner

Primary Examiner—Christian Wilson
Assistant Examiner—Douglas Menz
(74) Attorney, Agent, or Firm—Darryl G. Walker; Bradley T. Sako

(57) ABSTRACT

A semiconductor device including an IGFET (insulated gate field effect transistor) (30) is disclosed. IGFET (30) may include a source/drain area (15) having an impurity concentration distribution that may be formed shallower at a higher concentration than the impurity concentration distribution in another source/drain area (7). A gate oxide film may include a first gate oxide film (5) adjacent to source/drain area (7) and a second gate oxide film (12) adjacent to source drain area (15). Second gate oxide film (12) may be thinner than first gate oxide film (5). An impurity concentration distribution of a second channel impurity area (11) under second gate oxide film (12) may be at a higher concentration than an impurity concentration distribution of a first channel impurity area (9) under first gate oxide film (5). In this way, an electric field at a PN junction of source/drain area (7) may be reduced.

7 Claims, 9 Drawing Sheets

US 6,943,400 B2

SEMICONDUCTOR DEVICE AND ITS MANUFACTURING METHOD

This application is a divisional of patent application Ser. No. 10/106,642 now U.S. Pat. No. 6,638,801, filed Mar. 26, 2002.

TECHNICAL FIELD

The present invention relates generally to a semiconductor device and more specifically to a semiconductor device including an insulated gate field effect transistor (IGFET) having a source and drain with differing impurity concentrations and its manufacturing method.

BACKGROUND OF THE INVENTION

Large scale integrated semiconductor devices include semiconductor memory devices and semiconductor logic devices. Many of these semiconductor devices employ MOSFETs (metal oxide semiconductor field effect transistors) due to their manufacturability and performance to provide highly integrated circuits. Semiconductor memories include DRAMs (dynamic random access memories) and SRAMs (static random access memories). DRAMs provide a smaller bit/area and thus have reduced costs and are employed in a variety of data storage applications.

A DRAM includes a plurality of memory cells arranged in an array configuration. Each memory cell includes a memory cell transistor and a memory cell capacitor (capacitor element). Information is stored in a memory cell by storing electric charges on a memory cell capacitor. A memory cell transistor is turned on to select a memory cell to provide access to the memory cell capacitor to read data from or write data to the memory cell capacitor. A memory cell transistor in a DRAM is typically a MOSFET.

As is well known, a MOSFET includes a source area and a drain area, both being formed with a predetermined conductivity type on a semiconductor substrate. A MOSFET also includes a gate electrode formed on a gate insulating film over a channel area between the source area and drain area. An impedance path between the source area and drain area is controlled by applying a control voltage to the gate electrode. In this way, the conductivity of the channel area is controlled.

Japanese Patent Laid-Open No. 66861/1985 discloses a manufacturing method for a conventional MOSFET. FIGS. 1A–1C are cross-sectional views illustrating various processing steps for a conventional MOSFET as disclosed in Japanese Patent Laid-Open No. 66861/1985.

Referring now to FIG. 1A, a selective oxidation method is used to form a field oxide film 102 on the surface of a P-type silicon substrate 101. A CVD oxide film 103 and gate oxide film 104 are then formed on a device formation area. A gate electrode 105 is then formed on a side wall of CVD oxide film 103 to cover a part of gate oxide film 104.

Referring now to FIG. 1B, CVD oxide film 103 and gate oxide film 104 are etched and removed to leave behind only gate electrode 105 and gate oxide film 104 located just under gate electrode 105. An N-type impurity, such as arsenic (As), for example, is then implanted with a low dose through ion implantation using gate electrode 105 as a mask.

Referring now to FIG. 1C, a CVD oxide film 106 is then formed on a side wall of gate electrode 105. Then an N-type impurity, such as arsenic (As), for example, is implanted with a high dose through ion implantation using gate electrode 105 and CVD oxide film 106 as a mask. The ion doped arsenic is then diffused by being subjected to a heat treatment to form a LDD (lightly doped drain) structure MOSFET including an $N^+$ type (high concentration N-type conductivity) area and an $N_-$ type (low concentration N-type conductivity) area.

The conventional manufacturing method for a semiconductor device as described above has a drawback in that the source area and the drain area are both formed with the same impurity concentration distribution. By doing so, the performance when operating in in some applications may be limited.

In the conventional manufacturing method for a MOSFET disclosed in Japanese Patent Laid-Open No. 66861/1985, the source area and drain area are formed in the same process by implanting an impurity ion in a common process step. By doing so, the impurity concentration distributions in these areas are symmetrical. In this case, the source area and the drain area are compatible with a basic or typical performance of a MOSFET. However, in some applications a MOSFET having impurity concentration distributions that are the same in the source area and drain area may have drawbacks.

In light of the above discussion, it would be desirable to provide a semiconductor device including an insulated gate field effect transistor (IGFET), such as a MOSFET, that includes a source/drain area that has a lower impurity concentration distribution than the other source/drain area. It would also be desirable to provide such an IGFET in a memory cell of a semiconductor memory device, such as a DRAM. It would also be desirable to provide a manufacturing method for the semiconductor device.

SUMMARY OF THE INVENTION

A semiconductor device according to the present embodiments may include an IGFET (insulated gate field effect transistor). An IGFET may include a source/drain area having an impurity concentration distribution that may be formed shallower at a higher concentration than the impurity concentration distribution in another source/drain area. A gate oxide film may include a first gate oxide film adjacent to a source/drain area and a second gate oxide film adjacent to another source drain area. A second gate oxide film may be thinner than a first gate oxide film. An impurity concentration distribution of a second channel impurity area under a second gate oxide film may be at a higher concentration than an impurity concentration distribution of a first channel impurity area under a first gate oxide film. In this way, an electric field at a PN junction of a source/drain area may be reduced.

According to one aspect of the embodiments, a semiconductor device may include a first source/drain area of a second conductivity type formed in a semiconductor area of a first conductivity type. A second source/drain area of the second conductivity type may be formed in the semiconductor area. A gate electrode may be formed on a gate insulating film on a channel area disposed between the first source/drain area and the second source/drain area. The gate insulating film may include a first gate insulating film formed on a first channel area portion and a second gate insulating film formed on a second channel area portion. A second type impurity concentration distribution in the first source/drain area may be different from the second type impurity concentration distribution in the second source/drain area. A thickness of the first gate insulating film maybe different from a thickness of the second gate insulating film.

According to another aspect of the embodiments, a semiconductor device may include a first source/drain area of a second conductivity type formed in a semiconductor area of a first conductivity type. A second source/drain area of the second conductivity type may be formed in the semiconductor area. A gate electrode may be formed on a gate insulating film on a channel area disposed between the first source/drain area and the second source/drain area. The channel area may include a first a first channel area and a second channel area. A second type impurity concentration distribution in the first source/drain area may be different from the second type impurity concentration distribution in the second source/drain area. A first type impurity concentration distribution of the first channel area may be different from the first type impurity concentration distribution of the second channel area.

According to another aspect of the embodiments, a first type impurity concentration distribution in the first channel area portion may be different from the first type impurity concentration distribution in the second channel area portion.

According to another aspect of the embodiments, the first gate electrode and the second gate electrode maybe formed in a side wall configuration.

According to another aspect of the embodiments, the first gate electrode and the second gate electrode may be electrically connected through a third gate electrode.

According to another aspect of the embodiments, an insulating film may be formed between the first gate electrode and the second gate electrode.

According to another aspect of the embodiments, the first channel area portion may be adjacent to the first source/drain area. The second channel area portion may be adjacent to the second source/drain area. The second type impurity concentration in the first source/drain area may be lower than the second type impurity concentration in the second source/drain area. The first gate insulating film may be thicker than the second gate insulating film.

According to another aspect of the embodiments, a capacitor may be electrically connected to the first source/drain area. A bit line may be electrically connected to the second source/drain area. The second type impurity concentration in the first source/drain area may be lower than the second type impurity concentration in the second source/drain area.

According to another aspect of the embodiments, the second source/drain area may provide a common source/drain area for a pair of memory cells.

According to another aspect of the embodiments, the gate insulating film may include a first gate insulating film formed on the first channel area and a second gate insulating film formed on the second channel area. A thickness of the first gate insulating film may be different from a thickness of the second gate insulating film. The first gate electrode may be formed on the first gate insulating film. The second gate electrode may be formed on the second gate insulating film.

According to another aspect of the embodiments, the first channel area may be adjacent to the first source/drain area. The second channel area may be adjacent to the second source/drain area. The second type impurity concentration in the first source/drain area may be lower than the second type impurity concentration in the second source/drain area. The first type impurity concentration in the first channel area may be lower than the first type impurity concentration in the second channel area.

According to another aspect of the embodiments, a semiconductor device may include a first source/drain area of a second conductivity type formed in a semiconductor area of a first conductivity type. A second source/drain area of the second conductivity type may be formed in the semiconductor area. A gate electrode may be formed on a gate insulating film on a channel area between the first source/drain area and the second source/drain area. A manufacturing method for the semiconductor device may include the steps of forming a first insulating film on the semiconductor area, forming a first mask layer at a predetermined position on the first insulating film, forming the first source/drain area in the semiconductor area with the first mask layer, forming a second mask layer on the first source/drain area, forming a first channel area of the first conductivity type adjacent to the first source/drain area with the second mask layer, forming a first gate electrode on the side walls of the second mask layer, forming a second channel area of the first conductivity type at an essentially central portion of the first channel area with the first gate electrode providing a mask, forming a second insulating film on the second channel area, forming a second gate electrode over the second insulating film and separated from the first gate electrode by a mediating insulating film, forming the second source/drain area at a substantially central portion of the second channel area with the second gate electrode providing a mask, and forming a third gate electrode providing an electrical connection for the first gate electrode and the second gate electrode. The second insulating film may have a different thickness than the first insulating film.

According to another aspect of the embodiments, a second type impurity concentration distribution of the first source/drain area may be different than the second type impurity concentration distribution of the second source/drain area.

According to another aspect of the embodiments, a first type impurity concentration distribution of the first channel area may be different from the first type impurity concentration distribution of the second channel area.

According to another aspect of the embodiments, a manufacturing method of a semiconductor device may include forming a capacitor electrically connected to the first source/drain area.

According to another aspect of the embodiments, a second type impurity concentration of the first source/drain area may be lower than the second type impurity concentration of the second source/drain area.

DETAILED DESCRIPTION OF THE EMBODIMENTS

Various embodiments of the present invention will now be described in detail with reference to a number of drawings.

First Embodiment:

A first embodiment of a semiconductor device according to the present invention will now be described with reference to FIG. 2. A memory cell of a DRAM (dynamic random access memory) and its manufacturing method may be used as an example.

Figure 1A:
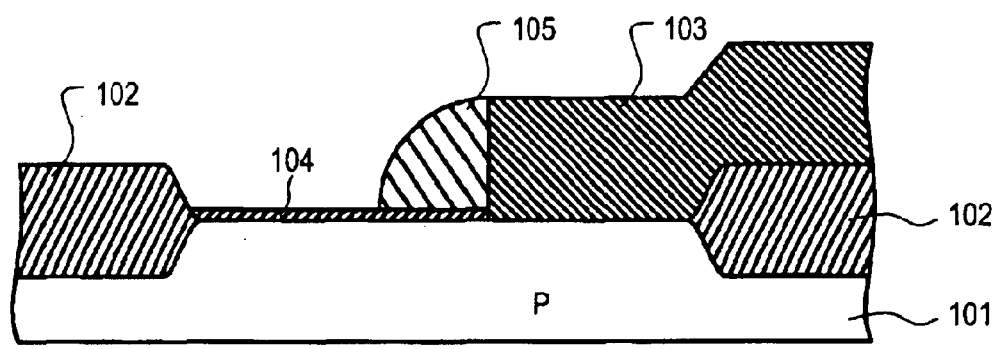
FIGS. 1A–1C are a cross-sectional view illustrating various processing steps for a conventional MOSFET.
Figure 1B:
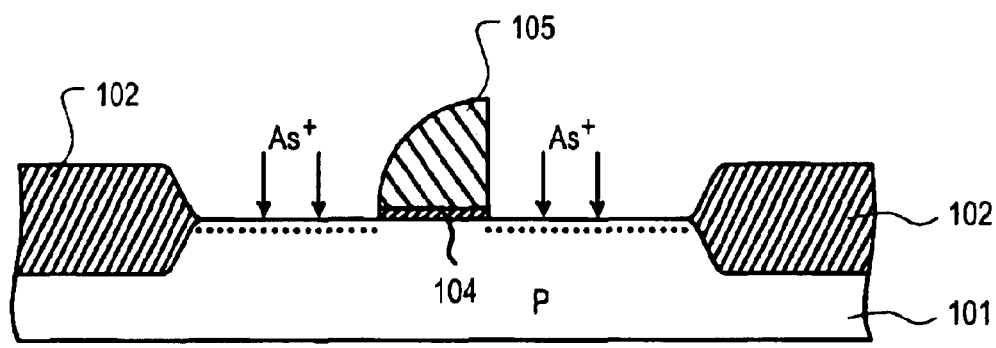
Figure 1C:
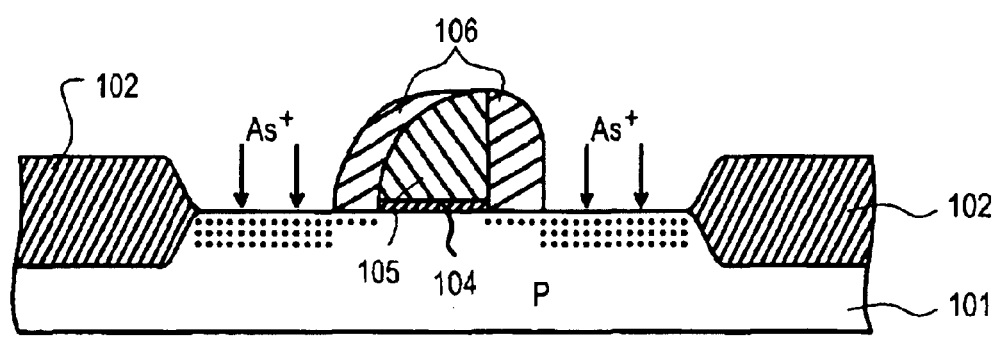
Figure 2:
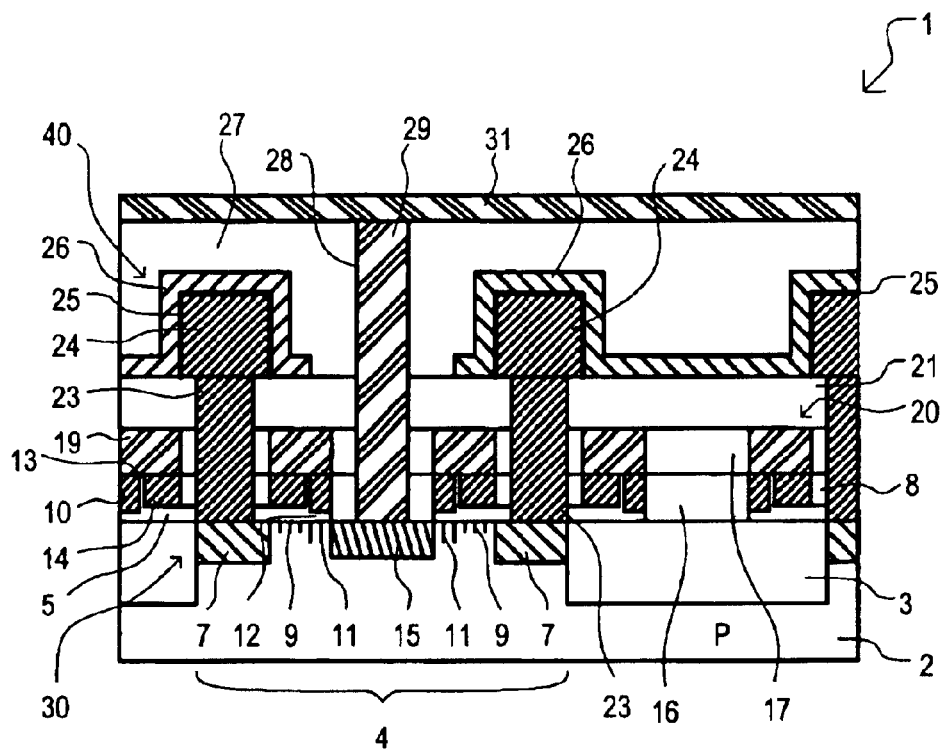
FIG. 2 is a cross sectional view of a semiconductor device according to a first embodiment.

FIG. 2 is a cross sectional view of a semiconductor device according to a first embodiment. Referring now to FIG. 2, a semiconductor device 1 according to a first embodiment may include an activate area 4 surrounded by a device isolation area 3 in a P-type silicon substrate 2, for example. Device isolation area 3 may be a shallow trench isolation (STI) type structure. Active area 4 may include a pair of low concentration N-type source areas (or drain areas) 7 formed adjacent to device isolation area 3. A low concentration N-type drain area (or source area) 15 may be formed at essentially the center of active area 4. Low concentration N-type drain area 15 may have a different impurity concentration distribution from that of source area 7.

A P-type first channel impurity area 9 may be formed in a channel region adjacent to source area 7. A P-type second channel impurity area 11 may be formed in a channel region adjacent to drain area 15. First channel impurity area 9 may have a different impurity concentration distribution than that of second channel impurity area 11. A first gate oxide film 5 may be formed with a silicon oxide film on first channel impurity area 9. First gate oxide film 5 may have a thickness of about 10 nm. A second gate oxide film 12 may be formed with a silicon oxide film on second channel impurity area 11. Second gate oxide film 12 may have a thickness of about 7 nm.

A side walled first gate electrode 10 and a second gate electrode 14 may be formed, respectively, on second gate oxide film 12 and first gate oxide film 5 and may be separated by a mediating silicon oxide film 13. A third gate electrode 19 may be formed on first and second gate electrodes (10 and 14) to provide a common electrical connection.

In this way, an IGFET (insulated gate field effect transistor) 30 may be formed having a gate electrode 20 including first gate electrode 10, second gate electrode 14, and third gate electrode 19 being commonly electrically connected. IGFET 30 may be a MOSFET (metal oxide semiconductor field effect transistor). Low-concentration N-type source area 7 may provide one source/drain terminal for IGFET 30 and low-concentration N-type drain area 15 may provide another source/drain terminal for IGFET 30. In this example, IGFET 30 may be used as a memory cell transistor of a DRAM (dynamic random access memory).

Low concentration N-type source areas 7 disposed on opposite sides of drain area 15 may be formed in self-alignment by making use of a dummy gate, described later, or a gate electrode, or the like.

Referring still to FIG. 2, semiconductor device 1 may include a storage node contact 23. Storage node contact 23 may provide an electrical connection between low concentration N-type source area 7 and a storage electrode 24. A capacitive insulating film 25 may be formed between storage electrode 24 and an opposite (plate) electrode 26. Storage electrode 24, capacitive insulating film 25 and opposite electrode 26 may collectively form a capacitor 40. Capacitor 40 may be a memory cell capacitor of a DRAM.

Collectively, IGFET 30 and capacitor 40 may form a memory cell for a DRAM.

Semiconductor device 1 may include a first insulating film 8, a second insulating film 16, a third insulating film 17, a fourth insulating film 21, and a fifth insulating film 27 formed on substrate 2. Insulating films (8, 16, 17, 21, and 27) may provide electrical isolation for IGFET 30 and capacitor 40, as well as similar IGFETs 30 and capacitors 40.

A bit contact 29 may be formed through second insulating film 16, third insulating film 17, fourth insulating film 21, and fifth insulating film 27. Bit contact 29 may provide an electrical connection between low concentration N-type drain area 15 and a bit line 31, which may be formed on fifth insulating film 27. In this way, a memory cell including IGFET 30 and capacitor 40 may be electrically connected to a bit line 31. IGFET 30 may provide a controllable impedance path between bit line 31 and a storage electrode 24 of capacitor 40. The controllable impedance path may be controlled by a potential applied to gate electrode 20. In this way, data may be written to or read from a DRAM memory cell including IGFET 30 and capacitor 40.

A manufacturing method for semiconductor device 1 will now be described with reference to FIGS. 3A to 3L. FIGS. 3A to 3L are cross-sectional views of semiconductor device after various processing steps according to an embodiment.

Figure 3A:
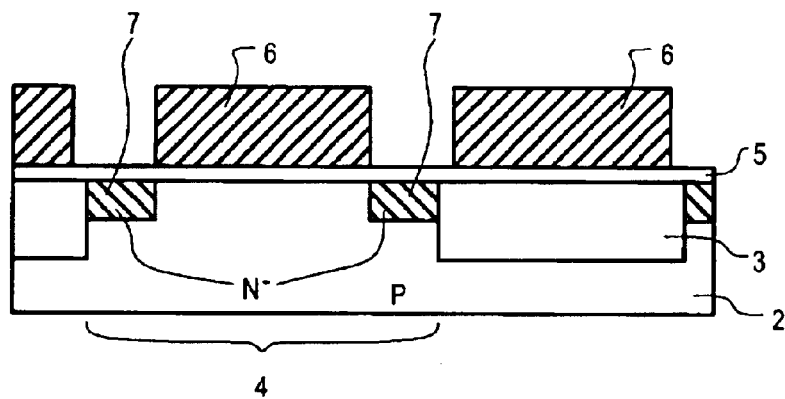
FIGS. 3A to 3L are cross-sectional views of semiconductor device after various processing steps according to the first embodiment.

Referring now to FIG. 3A, device isolation area 3 may be formed on P-type silicon substrate 2. Device isolation area 3 may be formed with a well known shallow trench isolation (STI) technique. In this way, an active area 4 may be formed surrounded by device isolation area 3. First gate oxide film 5 may then be formed on the entire surface. First gate oxide film 5 may include a silicon oxide film and may have a thickness of about 10 nm. A polysilicon film may then be formed on the entire surface. The polysilicon film may be formed with a CVD (chemical vapor deposition) method and may have a thickness of about 200 nm. The polysilicon film may be patterned into a desired pattern by using a well known lithography method and dry etching method. In this way, a dummy gate 6 may be formed on device isolation area 3 and over essentially a center portion of active area 4.

Subsequently, an N-type impurity may be implanted through first gate oxide film 5 to form low concentration source area 7 using dummy gate 6 as a mask. The N-type impurity may be phosphorus, or the like, and may be implanted under conditions of 70 keV, $2\times10^{13}$ atoms/cm$^2$, for example. Source area 7 may be formed in self-alignment using dummy gate 6 as a mask. Source area 7 may be formed on opposite sides of low concentration N-type drain area 15, which will be formed in a later process. Source area 7 may serve as an electrode providing a connection to a storage electrode of a capacitor in a memory cell, such as a DRAM memory cell.

A clean first gate oxide film 5 may be formed by subjecting silicon substrate 2 to a surface processing by etching first gate oxide film 5 and then re-oxidizing the same just before or just after the afore-mentioned phosphorus ion implantation.

Figure 3B:
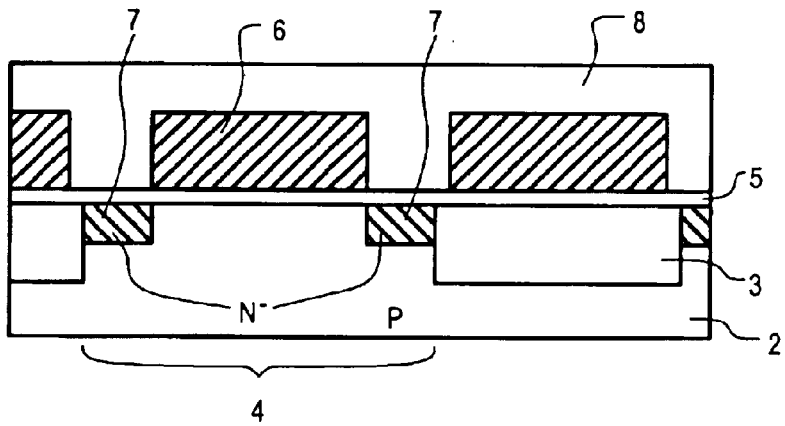

Referring now to FIG. 3B, a first insulating film 8 may be formed over the entire surface. First insulating film 8 may be formed with a CVD method and may have a thickness of about 800 nm. A top surface of first insulating film 8 may then be flattened with CMP (chemical mechanical polishing), or the like.

Figure 3C:
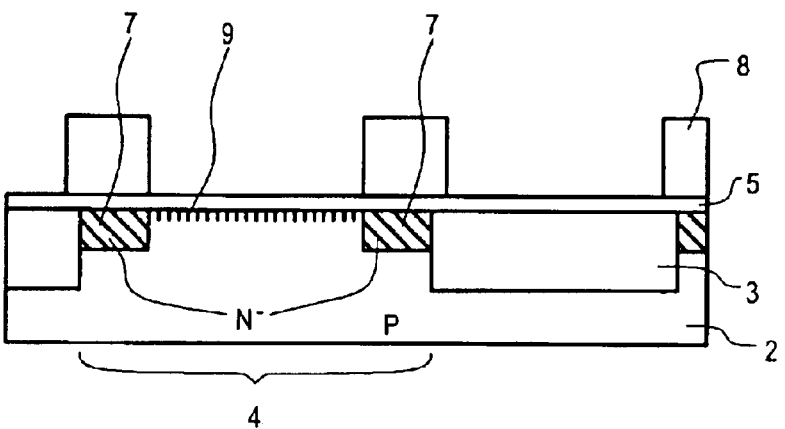

Referring now to FIG. 3C, first insulating film 8 may be removed with a CMP method, a dry etching method, a wet etching method, or the like, until dummy gate 6 is exposed. Dummy gate 6 may then be removed with an etching method. In this way, first gate oxide film 5 covering essentially a central portion of active area 4 may be exposed.

A P-type impurity may then be implanted through first gate oxide film 5 to form P-type first channel impurity area 9. The P-type impurity may be boron (B), or the like, and may be implanted under conditions of 30 keV, $5 \times 10^{12}$ atoms/cm$^2$, for example. P-type first channel impurity area 9 may be in contact with source area 7 and may be formed in self alignment using first insulating film 8 as a mask.

Figure 3D:
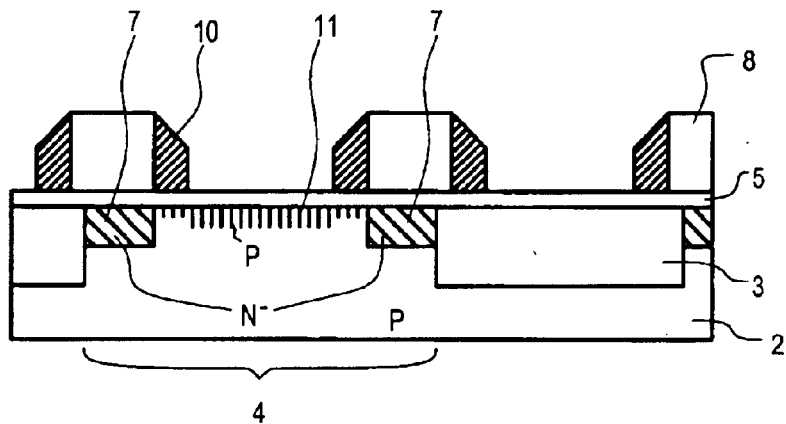

Referring now to FIG. 3D, a polysilicon film may then be formed over the entire surface with a CVD method. The polysilicon film may have a thickness of about 100 nm and may be doped with phosphorus, or the like. An unnecessary portion of the polysilicon film may be removed by anisotropic etching to form side walled first gate electrode 10. Side walled first gate electrode 10 may be formed over first gate oxide film 5 on side walls of first insulating film 8.

Figure 3E:
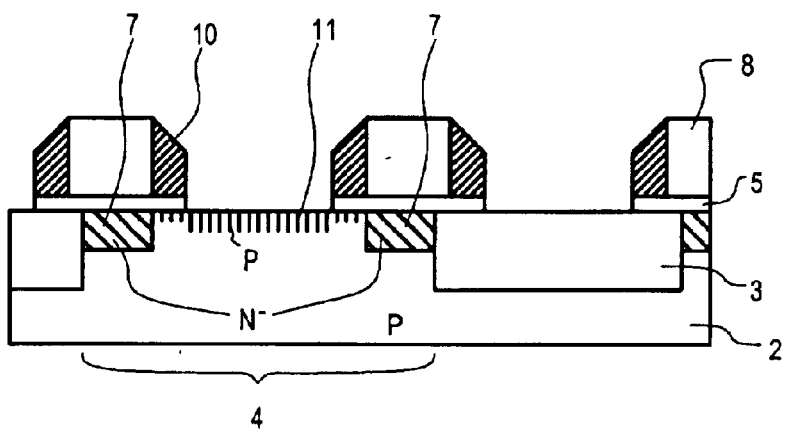

Referring now to FIG. 3E, exposed first gate oxide film 5 between first gate electrodes 10 may be removed with an etching method to expose essentially a central portion of active area 4. A P-type impurity ion may then be implanted in self alignment using first gate electrode 10 as a mask. The P-type impurity ion may be boron, or the like, and may be implanted under conditions of 30 keV, $8 \times 10^{12}$ atoms/cm$^2$, for example. In this way, P-type second channel impurity area 11 may be formed in an essentially central portion of first channel impurity area 9.

Figure 3F:
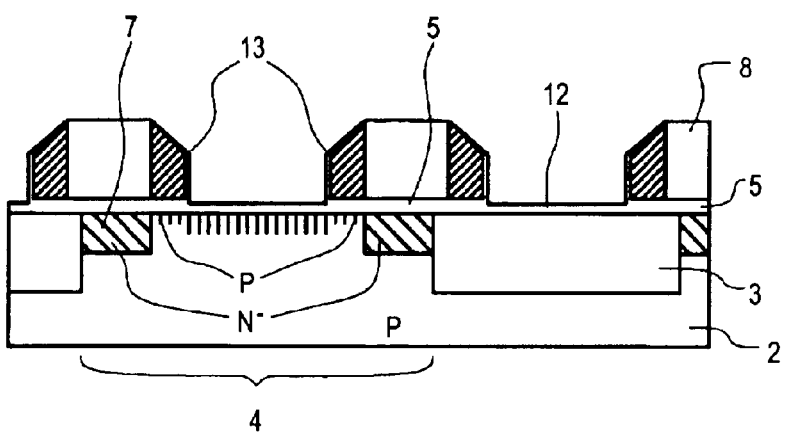

Referring now to FIG. 3F, a silicon oxide film may be formed on an exposed surface of an essentially central portion of active area 4. The silicon oxide film may be formed using a thermal oxidization method and may have a thickness of about 7 nm. In this way, second gate oxide film 12 may be formed adjacent to first gate oxide film 5. At the same time, side surfaces of first gate electrode 10 may be oxidized to form silicon oxide film 13. Silicon oxide film 13 may have a thickness of about 14 nm. Just before the afore-mentioned oxidation processing to form second gate oxide film 12, a surface processing such as slightly etching a surface of substrate 2 may be allowed.

Figure 3G:
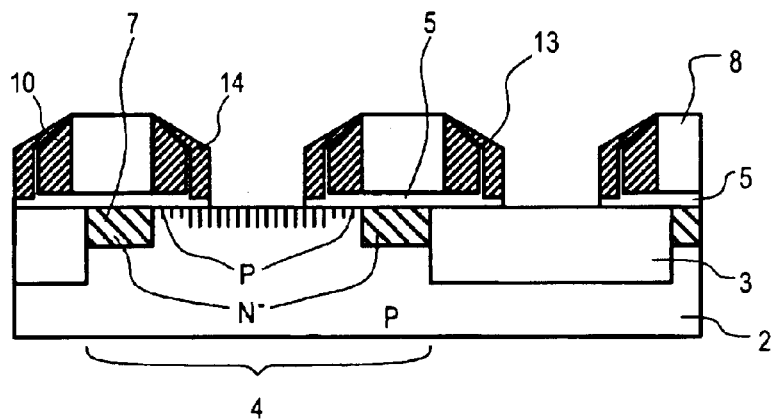

Referring now to FIG. 3G, a polysilicon film may be formed on the entire surface using a CVD method. The polysilicon film may be phosphorus doped and may have a thickness of about 100 nm. An unnecessary portion of the polysilicon film may be removed with anisotropic etching. In this way, a side walled second gate electrode 14 may be formed on a side surface of silicon oxide film 13 and on second gate oxide film 12. At the same time, an unnecessary portion of the silicon oxide film formed on the exposed surface of essentially a central portion of active area may be removed by etching.

Figure 3H:
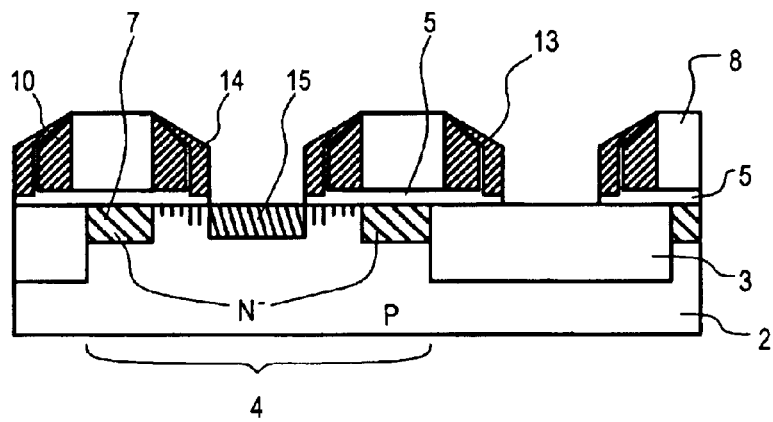

Referring now to FIG. 3H, low concentration N-type drain area (or source area) 15 may be formed essentially at a central portion of second channel impurity area 11. Low concentration N-type drain area 15 may be formed in self alignment by ion-implanting an N-type impurity using second gate electrode 14 as a mask. The N-type impurity may be phosphorus, or the like, implanted under conditions of 50 keV, $4 \times 10^{13}$ atoms/cm$^2$, for example. Drain area 15 may form an electrode to provide an electrical connection for a DRAM memory cell to a bit line, as described later.

Figure 3I:
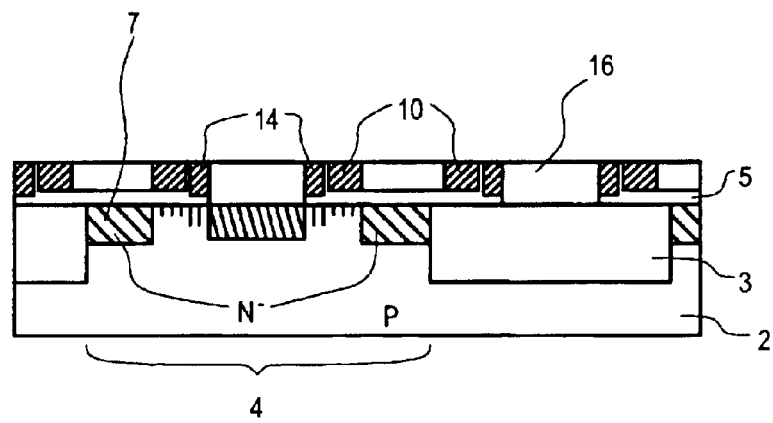

Referring now to FIG. 3I, second insulating film 16 may be formed on the entire surface. Second insulating film 16 may be formed using a CVD method and may have a thickness of about 800 nm. The surface of second insulating film 16 may then be flattened with a CMP method. The flattening process may be continued until top surfaces of first gate electrode 10 and second gate electrode 14 are exposed.

Figure 3J:
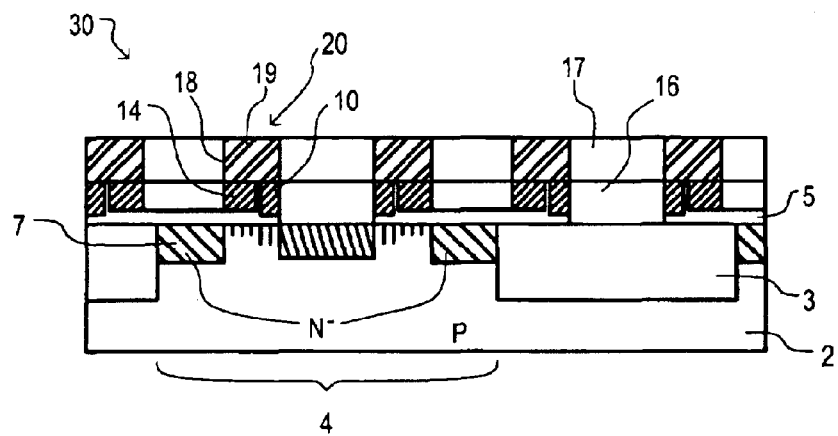

Referring now to FIG. 3J, third insulating film 17 may be formed on the entire surface. Third insulating film 17 may include a silicon oxide film formed using a CVD method and may have a thickness of about 100 nm. Third insulating film 17 on first gate electrode 10 and second gate electrode 14 may be removed by etching to form a trench 18. Then, a conductive film may be formed on the entire surface. The conductive film may include tungsten silicide, for example, formed using a CVD method. Unnecessary portions of the conductive film may then be removed to form third gate electrode 19 in trench 18. In this way, first gate electrode 10, second gate electrode 14 may be commonly connected through third gate electrode 19 to collectively form one gate electrode 20.

IGFET 30 may be formed including source area (storage node side area) 7, drain area (bit line side area) 15, first gate oxide film 5, second gate oxide film 12, and gate electrode 20. IGFET 30 may be a memory cell transistor of a DRAM memory cell. Gate electrode 20 may be commonly connected to a row of memory cells as a word line.

Figure 3K:
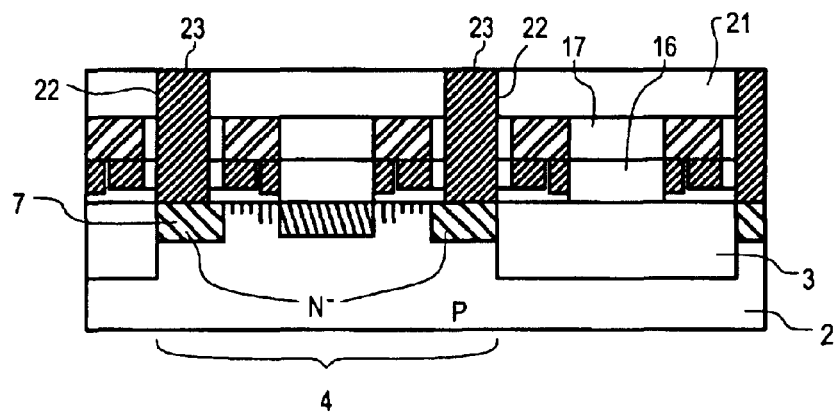

Referring now to FIG. 3K, fourth insulating film 21 may be formed on the entire surface. Fourth insulating film 21 may include a silicon oxide film formed using a CVD method and may have a thickness of about 100 nm. An etching method may then be used to form a contact hole 22 over source area (storage node side area) 7. Contact hole 22 may pass through fourth insulating film 21, third insulating film 17, and first insulating film 8 to expose source area (storage node side area) 7.

Subsequently, a polysilicon film, for example, may be formed over the entire surface. The polysilicon film may be formed with a CVD method. Unnecessary portions of the polysilicon film may be removed with a CMP method, or the like, to embed polysilicon film in contact hole 22. In this way storage node contact 23 may be formed.

Figure 3L:
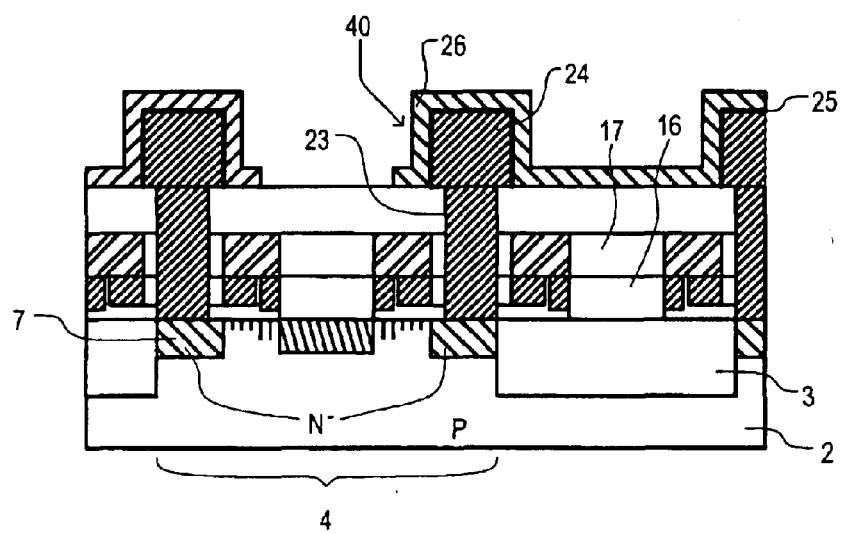

Referring now to FIG. 3L, a conductive film may be formed over the entire surface. The conductive film may include a phosphorus doped polycrystalline silicon film, or the like, and may be formed with a CVD method. The conductive film may be patterned with a lithography technique and a dry etching technique. In this way, storage node electrode 24 may be formed and may be electrically connected with storage node contact 23.

An insulating film may then be formed over the entire surface. The insulating film may include a silicon nitride film, or the like, and may be formed with a CVD method. The insulating film may form a capacitive insulating film 25 on storage electrode 24. A conductive film may then be formed over the entire surface. The conductive film may include a polysilicon film, or the like, and may be formed with a CVD method. The polysilicon film may be doped with phosphorus, for example. The conductive film may be patterned into a desired configuration to form opposite electrode 26 on capacitive insulating film 25. Capacitor 40 may include storage electrode 24 electrically connected with source area (storage node side area) 7 of IGFET 30 through storage node contact 23.

Referring once again to FIG. 2, a fifth insulating film 27 may then be formed over the entire surface. Fifth insulating film 27 may include a silicon oxide film. A contact hole 28 may be formed over drain area (bit line side area) 15. Contact hole 28 may pass through fifth insulating film 27, fourth insulating film 21, third insulating film 17, and second insulating film 16 to expose drain area (bit line side area) 15. A polysilicon film, or the like, may then be formed over the entire surface. The polysilicon film may be doped with phosphorus, or the like, and may be formed with a CVD method. Unnecessary portions of the polysilicon may be removed with a CMP method, or the like, to embed the polysilicon in contact hole 28. In this way, bit line contact 29 may be formed.

Finally, bit line 31 may be formed on fifth insulating film 27. Bit line 31 may include tungsten, or the like, and may be formed with a CVD method followed by a pattern and etching step. In this way, a memory cell structure of a DRAM, as illustrated in FIG. 2 may be formed according to a first embodiment.

Figure 4:
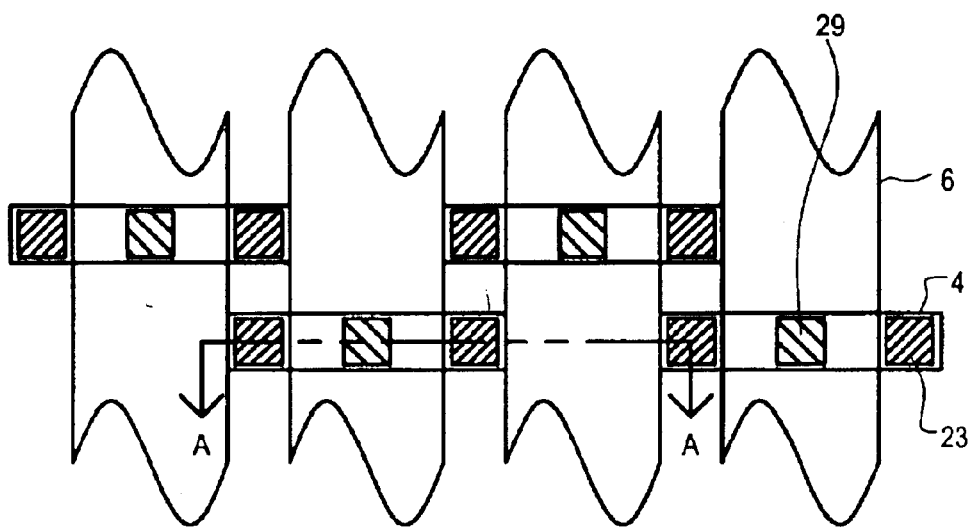
FIG. 4 is a top plan view illustrating an activate area, a dummy gate, a storage node contact, and a bit contact of a semiconductor device according to the first embodiment.

FIG. 4 is a top plan view illustrating an active area 4, a dummy gate 6, a storage node contact 23, and a bit contact 29 of a semiconductor device 1 according to the first embodiment. In FIG. 4, eight memory cells are illustrated with two memory cells sharing a bit contact 29.

In a completed IGFET 30, a gate wiring (not shown) connected with third gate electrode 19 may be disposed vertically along a dummy gate 6 direction, and bit line 31 may be disposed horizontally, such that it is connected with bit contacts 29 in a column direction. Each cross sectional view in FIG. 3 illustrates a cross sectional view along A—A line in FIG. 4.

In IGFET 30 manufactured with the aforementioned steps, low concentration N-type source area 7 and low concentration N-type drain area 15 may be formed so that impurity concentration distributions thereof may differ from each other as a first asymmetrical element.

Further, as a second asymmetrical element, P-type first channel impurity area 9 and P-type second channel impurity area 11 may have concentration distributions thereof that may differ from each other.

Furthermore, as a third asymmetrical element, first gate oxide film 5 and second gate oxide film 12 may have film thicknesses thereof that may differ from each other. A thickness of first gate oxide film 5 may be greater than a thickness of second gate oxide film 12.

Figure 5:
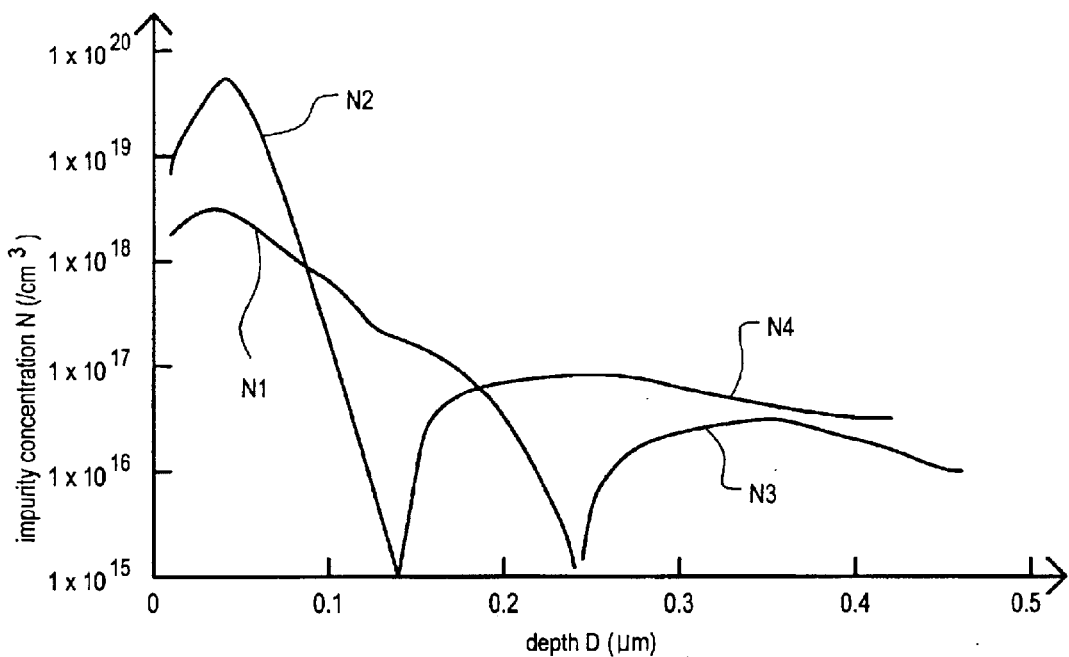
FIG. 5 is a graph illustrating impurity concentration distributions of a low concentration N-type source and a low concentration N-type drain area of an IGFET according to an embodiment.

The first asymmetrical element will now be illustrated with reference to FIG. 5. FIG. 5 is a graph illustrating impurity concentration distributions of low concentration N-type source 7 and low concentration N-type drain area 15 of IGFET 30.

In FIG. 5, the axis of ordinates indicates impurity concentration N, while the axis of abscissas indicates the depth D of each area. Line N1 indicates an impurity concentration distribution of source area 7. Line N2 indicates an impurity concentration distribution of drain area 15. Line N3 indicates an impurity concentration distribution in substrate 2 located on the side of source area 7. Line N4 indicates an impurity concentration distribution in substrate 2 located on the side of drain area 15.

As illustrated in FIG. 5, the impurity concentration distribution in source area 7 indicated by line N1 is formed deeper and at a lower concentration while the impurity concentration distribution in drain area 15 indicated by line N2 is formed more shallow and at a higher concentration.

Figure 6:
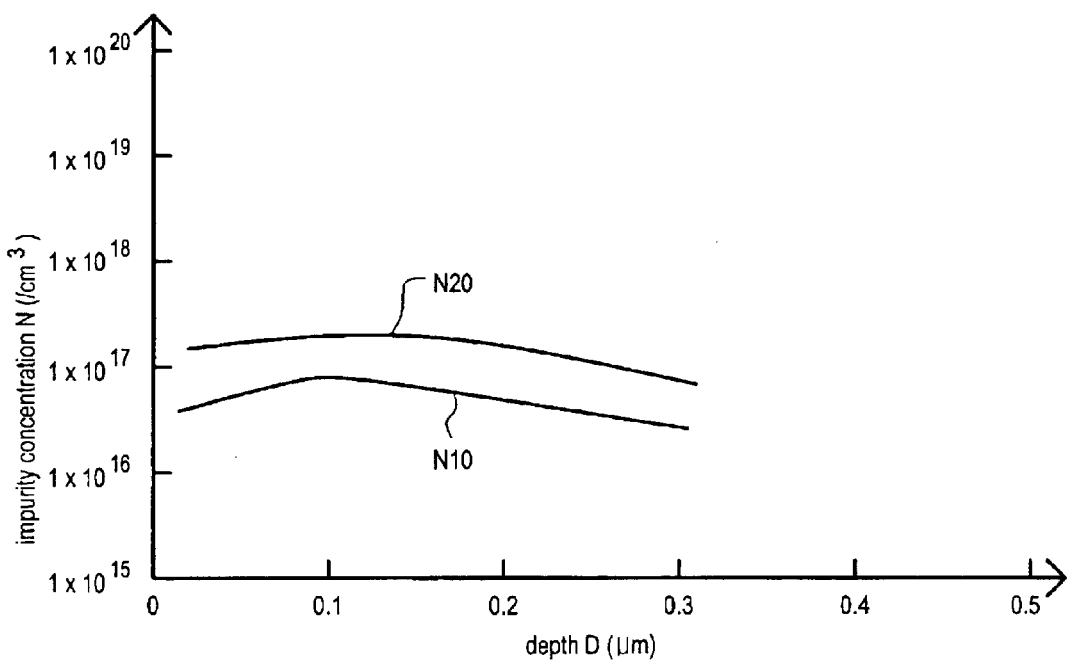
FIG. 6 is a graph illustrating impurity concentration distributions of a P-type first channel impurity area and a P-type second channel impurity area of an IGFET according to an embodiment.

The second asymmetrical element will now be illustrated with reference to FIG. 6. FIG. 6 is a graph illustrating impurity concentration distributions of P-type first channel impurity area 9 and P-type second channel impurity area 11 of IGFET 30.

In FIG. 6, the axis of ordinates indicates impurity concentration N, while the axis of abscissas indicates the depth D of each area. Line N10 indicates an impurity concentration distribution of first channel impurity area 9. Line N20 indicates an impurity concentration distribution of second channel impurity area 11.

As illustrated in FIG. 6, the impurity concentration distribution of first channel impurity area 9 indicated by line N10 is formed in a lower concentration than the impurity concentration distribution of second channel impurity area 11 indicated by line N20.

In the present example, silicon oxide film 13 formed simultaneously upon oxidation of second gate oxide film 12 may be left behind between first gate electrode 10 and second gate electrode 14 of gate electrode 20 included in IGFET 30. The existence of silicon oxide film 13 on the operation of IGFET 30 may be minimal. In particular, if the film thickness of silicon oxide film 13 is less than about 30 nm, the operating characteristics of IGFET 30 may not be appreciably affected.

Figure 7:
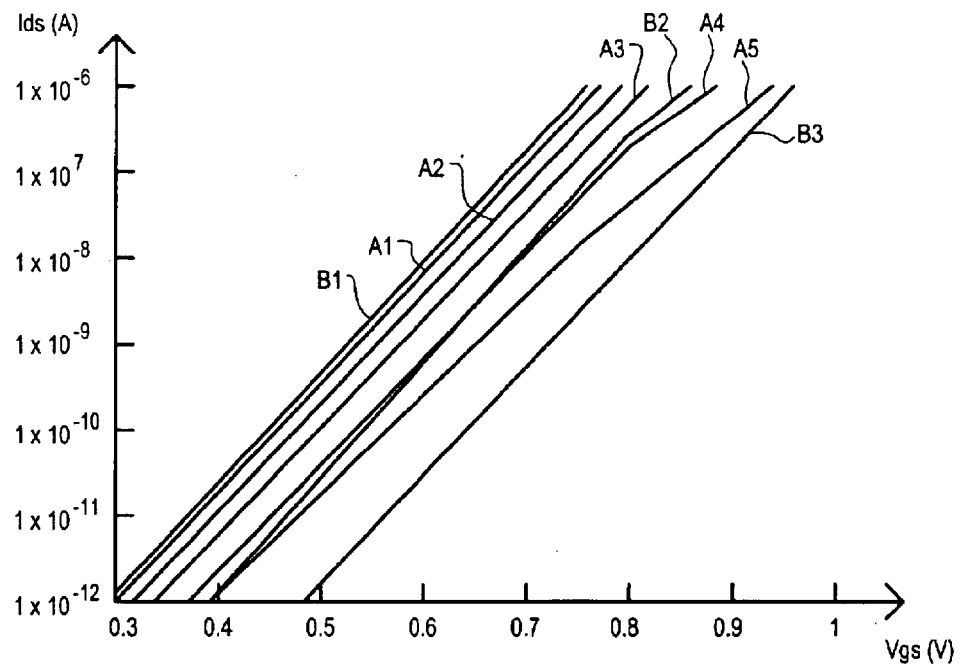
FIG. 7 is a graph illustrating a drain source current Ids of an IGFET versus a gate-source voltage Vgs for various IGFET configurations according to an embodiment.
Figure 8:
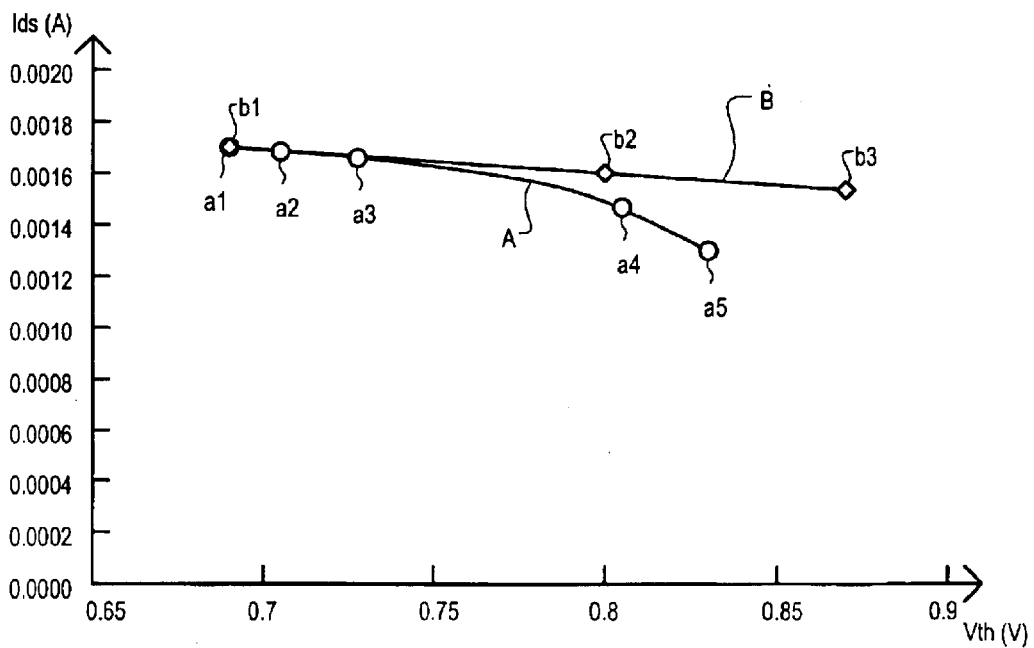
FIG. 8 is a graph illustrating a saturated current Ids of an IGFET versus a threshold voltage Vth for various IGFET configurations according to an embodiment.

An influence of silicon oxide film 13 left behind between first gate electrode 10 and second gate electrode 14 will now be discussed with reference to FIGS. 7 and 8. FIG. 7 is a graph illustrating a drain source current Ids of an IGFET versus a gate-source voltage Vgs for various IGFET configurations. FIG. 8 is a graph illustrating a saturated current Ids of an IGFET versus a threshold voltage Vth for various IGFET configurations.

Referring now to FIG. 7, the axis of ordinates indicates a drain-source current (such as a saturated current) Ids and the axis of abcissa indicates a gate-source voltage Vgs of an IGFET. Lines A1 to A5 illustrate a drain-source current Ids when a thickness of silicon oxide film 13 (FIG. 2) is 10 nm, 20 nm, 30 nm, 50 nm, and 70 nm, respectively. Lines B1 to B3 illustrate a drain-source current Ids, when silicon oxide film 13 does not exist, under varying boron concentrations where the boron concentration increases in the order of lines B1 to B3, respectively.

As evidenced in FIG. 7, a drain-source current Ids of an IGFET does not significantly deteriorate due to an existence of silicon oxide film 13.

Referring now to FIG. 8, the axis of ordinates indicates a saturated current Ids and the axis of abcissa indicates a threshold voltage Vth of an IGFET. Line A indicates a saturated current Ids of an IGFET including silicon oxide film 13. Points a1 to a5, indicated by circles, correspond to lines A1 to A5 in FIG. 7. Line B indicates a saturated current Ids of an IGFET when silicon oxide film 13 does not exist. Points b1 to b3, indicated by a diamond shape, correspond to lines B1 to B3 in FIG. 7.

As evidenced from FIG. 8, even when silicon oxide film 13 exists, essentially identical saturated currents Ids may be obtained at an essentially identical threshold voltage to that of a situation where a silicon oxide film 13 does not exist up to a thickness of about 30 nm of silicon oxide film 13. Thus, it can be understood that an existence of a silicon oxide film 13 does not appreciably influence saturated current Ids.

When a thin silicon oxide film 13 is formed, setting of the boron concentration slightly lee may bring about substantially the same IGFET operating characteristics as a case where a silicon oxide film 13 does not exist.

As described above, in a semiconductor device according to the present embodiment, low concentration N-type drain area 15 and low concentration N-type source area 7 may be formed in self alignment using respective constituent portions of gate electrode 20 such that impurity concentration distributions may be different as illustrated in FIG. 5 (first asymmetrical element). In this way, an IGFET 30 operable as a memory cell transistor of a DRAM memory cell may be formed having a first source/drain electrode having a different impurity concentration distribution than a second source/drain electrode.

Further, P-type first channel impurity area 9 and P-type second channel impurity area 11 may be formed in self alignment using first insulating film 8 and first gate electrode 10 such that impurity concentration distributions may be different as illustrated in FIG. 6 (second asymmetrical element).

Moreover, first gate oxide film 5 and second gate oxide film 12 may be formed, respectively, on P-type first channel impurity area 9 and P-type second channel impurity area 11 such they may have film thickness that are different (third asymmetrical element).

Accordingly, an IGFET 30 in the present embodiment an impurity concentration (line N1 of FIG. 5) on the low concentration N-type source area 7 side (storage node contact 23 side) may be formed more deeply and at lower concentration than an impurity concentration (line N1 of FIG. 5) on the low concentration N-type drain area 15 side (bit contact 29 side). First gate oxide film (film thickness of about 10 nm) 5 on the low concentration N-type source area 7 side may be formed thicker than second gate oxide film (film thickness of about 7 nm) 12 on low concentration N-type drain area 15 side. Further, an impurity concentration distribution (line N10 of FIG. 6) of P-type first channel impurity area 9 on the low concentration N-type source area 7 side (storage node contact 23 side) may be formed at a lower concentration than an impurity concentration distribution (line N20 of FIG. 6) of P-type second channel impurity area 11 on the low concentration N-type drain area 15 side (bit contact 29 side).

In this way, a PN junction electric field on low concentration N-type source area 7 may be reduced. By reducing a PN junction formed by an interface between N-type source area 7 and a substrate 2, a leakage current may be reduced. A reduced leakage current may contribute to better charge holding characteristics of capacitor 40. By improving charge holding characteristics, data integrity may be improved. Also, with improved charge holding characteristics of capacitor 40, the DRAM memory cells may have a decreased refresh rate. Decreasing the refresh rate may reduce current consumption in a system.

In the present embodiment, an impurity concentration distribution (line N2 of FIG. 5) on low concentration N-type drain area 15 side may be formed shallower at a higher concentration than an impurity concentration distribution (line N1 of FIG. 5) on low concentration N-type source area 7 side (storage node contact 23 side). A second gate oxide film (film thickness of about 7 nm) 12 on low concentration N-type drain area 15 side may be formed thinner than a first gate oxide film (film thickness of about 10 nm) 5 on low concentration N-type source area 7 side. Further, as illustrated in FIG. 6, impurity concentration distribution (line N20 of FIG. 6) of P-type second channel impurity area 11 on low concentration N-type drain area 15 side may be formed at a higher concentration than a concentration (line N10 of FIG. 6) of P-type first channel impurity area 9 on low concentration N-type source area 7 side (storage node contact 23 side).

Accordingly, characteristics, such as effective gate length of a transistor, and ratio of an operating current and a leakage current in a holding state may be improved compared to a conventional IGFET. More specifically, a high performance transistor may include a shorter effective gate length with a larger ratio of an operating current and a leakage current in a holding state.

Moreover, source area 7, drain area 15, first and second gate oxide films (5 and 12), and first and second channel impurity areas (9 and 11) may be formed in self alignment using respective portions of gate electrode 20. In this way, an IGFET including reduced manufacturing variations may be obtained.

Because first and second gate oxide films (5 and 12) may be formed with a side wall formation technique without the use of a lithography technique, a gate electrode thereof that may be smaller than a resolution limit of the lithography technique. In this way, an IGFET may be manufactured including minute features providing a high integration.

Second Embodiment:

A second embodiment of a semiconductor device according to present invention will now be described with reference to FIG. 9. A manufacturing method of a semiconductor device according to the second embodiment will be described with reference to FIGS. 10 and 11. An IGFET used as a single device in a semiconductor device and its manufacturing method may be used as an example.

Figure 9:
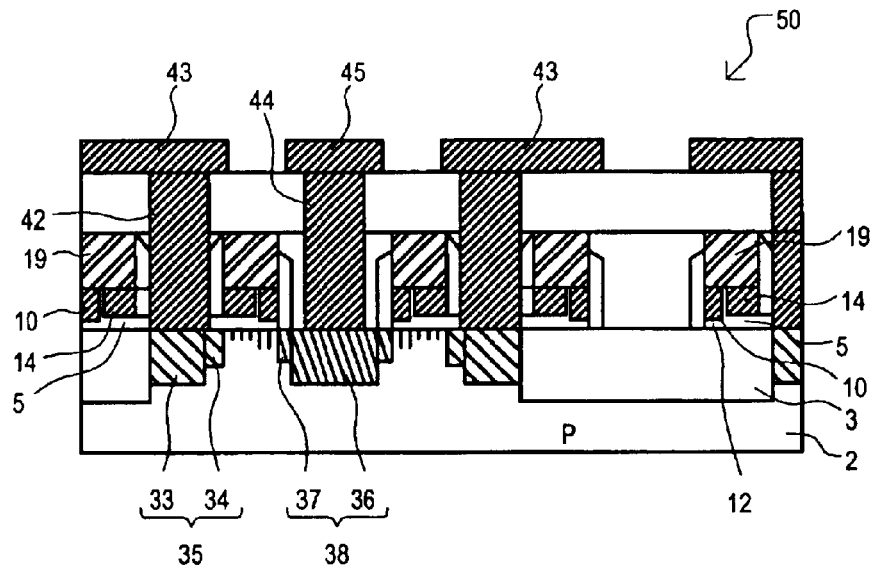
FIG. 9 is a cross sectional view of a semiconductor device according to a second embodiment.

FIG. 9 is a cross sectional view of a semiconductor device 50 according to a second embodiment. Semiconductor device 50 may include similar constituents as semiconductor device 1 illustrated in FIG. 2. Such constituents may be referred to by the same reference character.

Referring now to FIG. 9, a semiconductor device 50 according to a second embodiment may include an N-type source area (or drain area) 35 and an N-type drain area (or source area) 38. N-type source area 35 may include a high concentration N-type area 33 and a low concentration N-type area 34. N-type drain area 38 may include a high concentration N-type area 36 and a low concentration N-type area 37. In this way, N-type source area 35 and N-type drain area 38 may be formed in a LDD (lightly doped drain) structure. A source electrode 43 may be formed over and may be electrically connected to source area 35 through a source contact 42. A drain electrode 45 may be formed over and may be electrically connected to drain area 38 through a drain contact 44.

Figure 10:
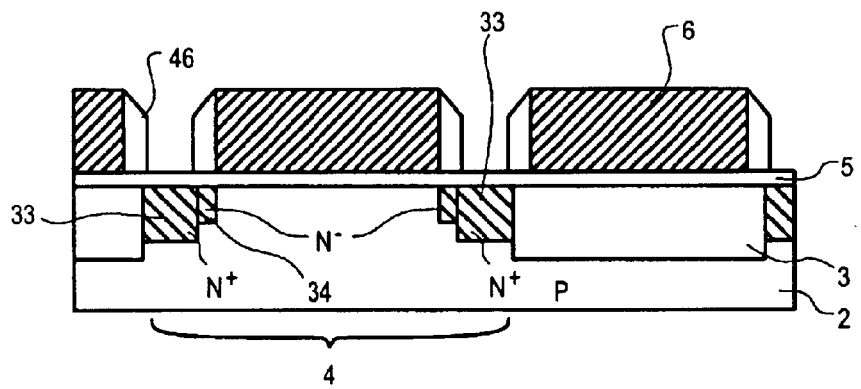
FIG. 10 is a cross-sectional view of a semiconductor device after various processing steps according to the second embodiment.
Figure 11:
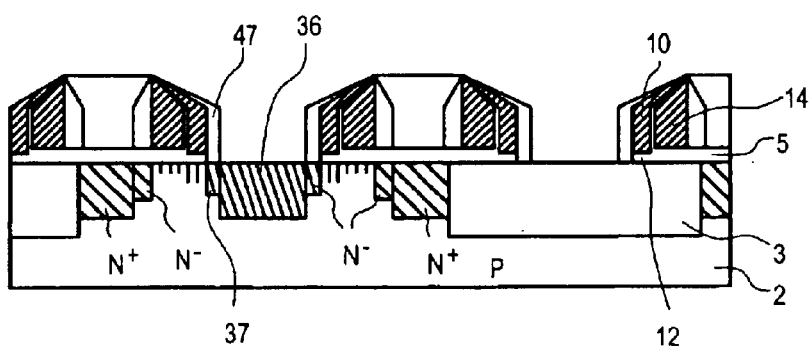
FIG. 11 is a cross-sectional view of a semiconductor device after various processing steps according to the second embodiment.

A manufacturing method for semiconductor device 50 will now be described with reference to FIGS. 10 and 11. FIGS. 10 and 11 are cross-sectional views of semiconductor device after various processing steps according to an embodiment.

Referring now to FIG. 10, in accordance with a process as illustrated in FIG. 3A of the first embodiment, in a semiconductor substrate 2, a low concentration N-type area 34 may be formed adjacent to device isolation area 3 in self alignment using a dummy gate 6. Then, a side wall insulating film 46 may be formed on side walls of dummy gate 6. Insulating film 46 may then be used to form a high concentration N-type area 33 in self alignment.

Referring now to FIG. 11, in accordance with a process as illustrated in FIG. 3H, a low concentration N-type area 37 may be formed in self alignment using a first gate electrode 10 as a mask. A side wall insulating film 47 may then be formed on sidewalls of first gate electrode 10. Using side wall insulating film 47, a high concentration N-type area 36 may then be formed in self alignment. Other processes may be essentially identical to the aforementioned first embodiment, and as such, a description thereof may be omitted.

In the present embodiment, even when an IGFET is employed as a single device, first to third asymmetrical elements as described in the first embodiment may be set so as to reduce a PN junction electric field on the drain area 38 side. In this way, a high performance IGFET may be obtained. The IGFET may have excellent hot carrier resistance, short effective gate length, and a large ratio of an operating current and a leakage current, to name just a few qualities. With an arrangement of the present embodiment, essentially identical effects to that of the first embodiment may be obtained.

It is understood that the embodiments described above are exemplary and the present invention should not be limited to those embodiments. Specific structures should not be limited to the described embodiments.

Although, for example, the above embodiments were described in terms of examples where first to third asymmetrical elements were simultaneously combined, the present invention is not limited as such. More specifically, even a combination of the first and second asymmetrical elements or a combination of the first and third asymmetrical elements may achieve the objects of the present invention. Moreover, although in the aforementioned description an IGFET, such as a MOSFET, using a silicon oxide film as a gate insulating film was described as an example, a nitride film may be employed as a gate insulating film, or a double film arrangement of an oxide film and a nitride film may be employed. More specifically, a MIS (metal insulating semiconductor) FET, MNS (metal nitride semiconductor) FET, or MNOS (metal nitride oxide semiconductor) FET may be emplotyed without being limited to a MOSFET, as just a few examples. Moreover, although a silicon oxide film was used for each insulating film for use in an interlayer insulting film, BSG (boron-silicate glass), PSG (phospho-silicate glass), BPSG (boron-phospho-silicate glass), or the like, may be useable, as just a few examples.

Further, the dose of impurity in ion implantation of the impurity for forming the source area or drain area and each channel impurity area of the aforementioned IGFET may be adjustable in response to the desired characteristics of an IGFET as required. Further, after the impurity ion implantation, annealing may be applied as is well known to form the respective semiconductor diffusion areas. Further, conductivity types of the respective semiconductor areas (P-type and N-type) may be reversed. The present invention may be applicable to a P-type IGFET, such as a P-channel MOSFET, as just one example. Although the device isolation area was formed using a STI technique as an example, a LOCOS (local oxidation of silicon) technique may be utilized, as just one example. Furthermore, conditions, such as film thicknesses of the insulating films, conductive films, or the like, and formation methods thereof were only exemplary and may be modified depending upon applications and objectives, etc.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device, comprising:
an insulated gate field effect transistor including
    a first source/drain area of a second conductivity type formed in a semiconductor area of a first conductivity type;
    a second source/drain area of the second conductivity type formed in the semiconductor area; and
    a gate electrode structure formed on a gate insulating film on a channel area disposed between the first source/drain area and the second source/drain area, the gate insulating film includes a first gate insulating film formed on a first channel area portion and a second gate insulating film formed on a second channel area portion, the gate electrode structure including a first gate electrode and a second gate electrode electrically connected through a third gate electrode; wherein
    a second type impurity concentration distribution in the first source/drain area is different from the second type impurity concentration distribution in the second source/drain area when viewed from the gate structure and a thickness of the first gate insulating film is different from a thickness of the second gate insulating film.

2. The semiconductor device according to claim 1, wherein:
a first type impurity concentration distribution in the first channel area portion is different from the first type impurity concentration distribution in the second channel area portion.

3. The semiconductor device according to claim 1, wherein:
the first gate electrode and the second gate electrode are formed in a side wall configuration with the first gate electrode and the second gate electrode being generally parallel with one another in a direction perpendicular to the gate insulating film.

4. The semiconductor device according to claim 1, wherein:
an insulating film is formed between the first gate electrode and the second gate electrode.

5. The semiconductor device according to claim 1, wherein:
the first channel area portion is adjacent to the first source/drain area and the second channel area portion is adjacent to the second source/drain area wherein the second type impurity concentration in the first source/drain area is lower than the second type impurity concentration in the second source/drain area and the first gate insulating film is thicker than the second gate insulating film.

6. The semiconductor device according to claim 1, further including:
a capacitor electrically connected to the first source/drain area; and
a bit line electrically connected to the second source/drain area wherein the second type impurity concentration in the first source/drain area is lower than the second type impurity concentration in the second source/drain area.

7. The semiconductor device according to claim 6, wherein:
the second source/drain area provides a common source/drain area for a pair of memory cells.

* * * * *